US008343850B2

(12) United States Patent
Guiot et al.

(10) Patent No.: US 8,343,850 B2
(45) Date of Patent: Jan. 1, 2013

(54) PROCESS FOR FABRICATING A SUBSTRATE COMPRISING A DEPOSITED BURIED OXIDE LAYER

(75) Inventors: Eric Guiot, Goncelin (FR); Fabrice Lallement, Aix-les-Bains (FR)

(73) Assignee: Soitec, Bernin (FR)

( * ) Notice: Subject to any disclaimer, the term of this patent is extended or adjusted under 35 U.S.C. 154(b) by 517 days.

(21) Appl. No.: 12/524,104

(22) PCT Filed: Feb. 12, 2008

(86) PCT No.: PCT/IB2008/000383
§ 371 (c)(1),
(2), (4) Date: Jul. 22, 2009

(87) PCT Pub. No.: WO2008/107751
PCT Pub. Date: Sep. 12, 2008

(65) Prior Publication Data
US 2010/0096733 A1  Apr. 22, 2010

(30) Foreign Application Priority Data
Mar. 6, 2007  (FR) ...................................... 07 53655

(51) Int. Cl.
*H01L 21/46* (2006.01)
(52) U.S. Cl. .................................. 438/458; 257/E21.211
(58) Field of Classification Search .................. 438/458, 438/514, 522, 526, 455, 106, 660; 257/E21.211, 257/E21.088, E21.335
See application file for complete search history.

(56) References Cited

U.S. PATENT DOCUMENTS

| 6,211,041 | B1 | 4/2001 | Ogura | 257/347 |
|---|---|---|---|---|
| 6,475,072 | B1 | 11/2002 | Canaperi et al. | 451/65 |
| 2004/0262686 | A1 | 12/2004 | Shaheen et al. | 438/458 |
| 2005/0269671 | A1 | 12/2005 | Faure et al. | 257/618 |
| 2006/0030123 | A1* | 2/2006 | Nevin et al. | 438/455 |
| 2006/0286771 | A1 | 12/2006 | Shaheen et al. | 438/458 |
| 2007/0032043 | A1 | 2/2007 | Endo et al. | 438/459 |
| 2007/0042566 | A1 | 2/2007 | Seacrist et al. | 438/458 |
| 2007/0117350 | A1 | 5/2007 | Seacrist et al. | 438/459 |

(Continued)

FOREIGN PATENT DOCUMENTS
EP  1 667 218  6/2006
(Continued)

OTHER PUBLICATIONS

International Search Report, PCT/IB2008/000383, Filed May 16, 2008. Soitec DTA Technical Note RT100064; RD0007 Oxide Benchmark Study for Bonding Improvement (2010).
A. W. Topol et al., "3D Fabrication Options for High-Performance CMOS Technology", Wafer Level 3 ICs Process Technology, pp. 197-217.

(Continued)

*Primary Examiner* — Hoa B Trinh
(74) *Attorney, Agent, or Firm* — Winston & Strawn

(57) ABSTRACT

A process for fabricating a substrate that includes a buried oxide layer for the production of electronic components or the like. The process includes depositing an oxide layer or a nitride layer on either of a donor or receiver substrate, and bringing the donor and receiver substrates into contact; conducting at least a first heat treatment of the oxide or nitride layer before bonding the substrates, and conducting a second heat treatment of the fabricated substrate of the receiver substrate, the oxide layer and all or part of the donor substrate at a temperature equal to or higher than the temperature applied in the first heat treatment. Substrates that have an oxide or nitride layer deposited thereon wherein the oxide or nitride layer is degassed and has a refractive index smaller than the refractive index of an oxide or nitride layer of the same composition formed by thermal growth.

16 Claims, 4 Drawing Sheets

U.S. PATENT DOCUMENTS

2010/0096733 A1  4/2010  Guiot et al. .......... 257/632

FOREIGN PATENT DOCUMENTS

FR         2 782 572      2/2000
WO     WO 2006/029651   3/2006

OTHER PUBLICATIONS

C.S. Tan et al., "Low-Temperature Thermal Oxide to Plasma-Enhanced Chemical Vapor Deposition Oxide Wafer Bonding for Thin-Film Transfer Application", Applied Physics Letters, vol. 82, No. 16, pp. 2649-2651 (2003).

* cited by examiner a)

b)

c)

d)

Variation in thickness of the oxide layer as a function of the thermal budget applied
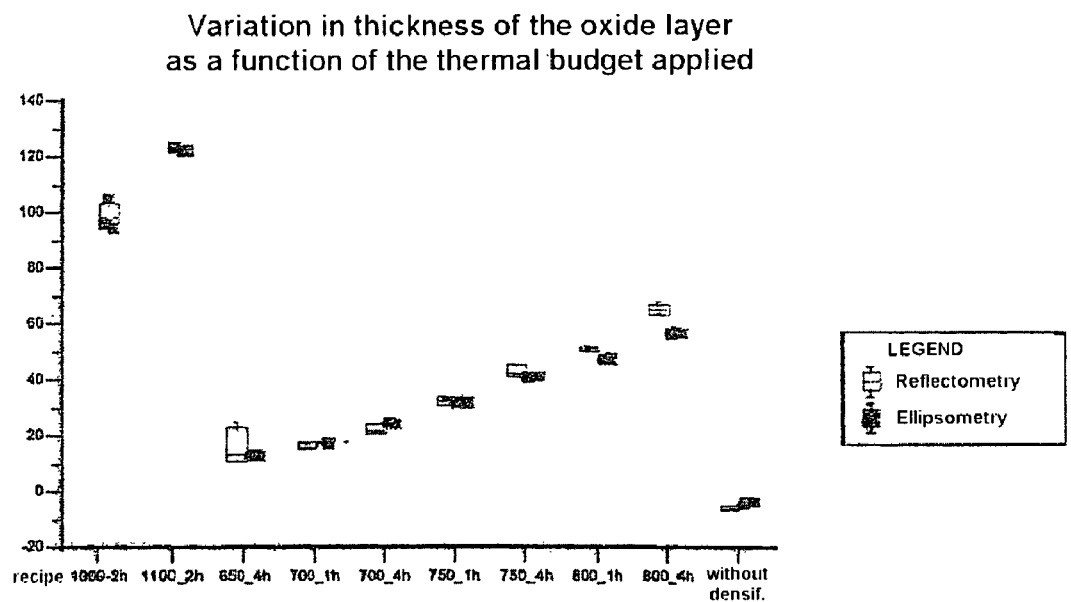
FIG.4
Variation in index as a function of the densification temperature
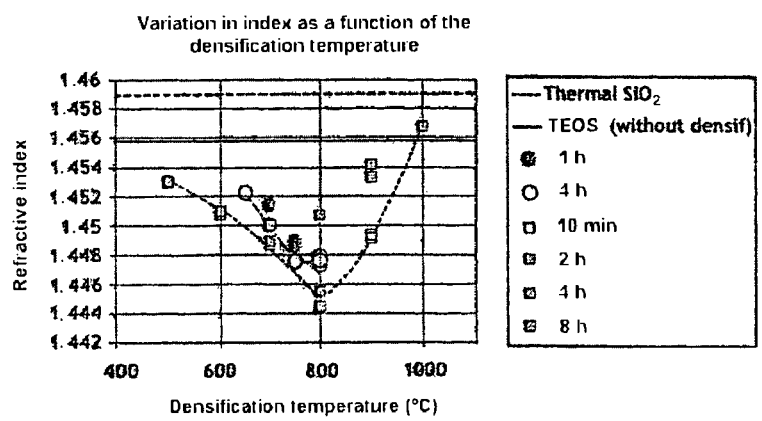
FIG.5
| 1% HF | Etching |
|---|---|
| No densif: | 8.2 A/s |
| Densif: 900°C/2 h | 2.3 A/s |
| Densif: 1000°C/2 h | 1.5 A/s |
| Densif: 1100°C/2 h | 1.1 A/s |
| Thermal oxide | 1.1 A/s |
FIG.6

PROCESS FOR FABRICATING A SUBSTRATE COMPRISING A DEPOSITED BURIED OXIDE LAYER

This application is a 371 filing of International Patent Application PCT/IB2008/000383 filed Feb. 12, 2008.

FIELD OF THE INVENTION

The present invention relates to a process for fabricating a substrate comprising a buried oxide layer, and more particularly substrates of the SeOI (Semiconductor On Insulator), SOI (Silicon On Insulator), sSOI (strained Silicon On Insulator) or UTBOX (Ultra Thin Buried Oxide) type, and relates to a process for bonding substrates having a deposited oxide.

BACKGROUND OF THE INVENTION

In the field of semiconductor substrates, such as SeOI and sSOI substrates, particularly for microelectronics, optoelectronics, etc:, it is well known to form an electrically insulating layer, such as an oxide or nitride layer, on at least one of the substrates in order to bond the two substrates brought into contact with each other during their fabrication or to protect the surface of the substrate against chemical contamination and scratching, in particular while they are being manipulated.

The oxide layer is formed either by direct oxidation, such as thermal or anodic oxidation, or by deposition of an oxide layer, the formation of a nitride layer being produced by deposition.

According to the first process for forming an oxide layer, said thermal oxidation is obtained in a furnace in which substrates, for example made of silicon, are submitted to a temperature of between 900 and 1200° C.

A gas is introduced into the furnace to oxidize the substrates, an oxide layer growing with time on said substrates. In the dry thermal oxidation process, the gas is oxygen and in the wet thermal oxidation process, the gas is water vapour.

The thermal oxidation process, and more particularly the dry thermal oxidation process, gives an oxide layer which has a very high quality, is particularly dense and has a high dielectric strength.

However, the drawback of process is the low rate of growth of the oxide layers.

The second type of process for forming an oxide layer, namely by deposition, includes several processes for depositing an oxide layer which are well known to those skilled in the art.

Most of these processes consist in particular of low-temperature CVD (Chemical Vapour Deposition), LPCVD (Light-Pressure Chemical Vapour Deposition) or PECVD (Plasma Enhanced Chemical Vapour Deposition) processes.

These oxides deposition are formed in a furnace in which for example silicon substrates are submitted to a temperature of between 300 and 800° C.

These processes allow the formation of thick oxide layers on the substrates in a relatively short time.

However, theses types of oxide layers are porous. The porosity of these oxide layers results in a low density of the layer, which impacts the quality of the transfer obtained by Smart Cut™ method, method described in the publication "Silicon-On-Insulator Technology: Materials to VLSI", by Jean-Pierre Colinge, 2nd edition, published by Kluwer Academic Publishers, pages 50 and 51.

The transfer of a layer by the Smart Cut™ method may be of poor quality when the deposited oxide layer has not been densified by a heat treatment.

The densification of these oxide layers can be obtained by application of an annealing at a temperature between 600 and 1200° C., for between 10 minutes and 6 hours, as described in the international patent application WO 2006/029651. This heat treatment also allows certain species, such as for example carbon, incorporated into the oxide during deposition, to be degassed.

However, during the fabrication of multilayer heterostructures, application of this heat treatment to densify an oxide, layer deposited on the multilayer substrate is limited to low-temperature ranges to avoid the appearance of defects and the diffusion of the species between the various layers of the substrate.

Specifically, during the various annealing steps during the Smart Cut™ method, the degassing of the deposited oxide layer may result in the formation of defects.

It should be noted that the same drawbacks occur in the case of nitride insulating layers.

BRIEF DESCRIPTION OF THE INVENTION

A first object of the invention is therefore to avoid these drawbacks by providing a process for fabricating a substrate comprising a deposited buried oxide layer for the production of electronic components or the like and leading to a deposited oxide layer having the same quality than a thermal oxide layer, within the final substrate.

For this purpose, the invention proposes a process for fabricating a substrate with a buried oxide layer for the production of electronic components or the like, comprising at least one deposition step of an oxide layer or nitride layer on a donor substrate and/or a receiver substrate, and a step of bringing the donor substrate into contact with the receiver substrate; said process comprises at least a first heat treatment of the oxide layer or nitride layer deposited on the donor substrate and/or the receiver substrate before bonding the donor substrate to the receiver, and a second heat treatment of the substrate consisting of the receiver substrate, the oxide layer and all or part of the donor substrate, at a temperature equal to or higher than the temperature applied in the first heat treatment.

The second heat treatment is a densification heat treatment.

The first heat treatment consists in applying a temperature of 600 to 1000° C., during few minutes to few hours in a non-oxidizing inert gas or a mixture of inert gases.

Preferably, the first heat treatment consists in applying a temperature of 800° C. for 2 to 4 hours.

Moreover, the second heat treatment consists in applying a temperature of 1000 to 1200° C. during few minutes to few hours in a non-oxidizing inert gas or a mixture of inert gases.

Said inert gas used the inert atmosphere or the mixture of inert gases is chosen from the following list: argon (Ar), nitrogen ($N_2$) and xenon (Xe).

Preferably, the oxide precursor is tetraethyl orthosilicate (TEOS) and the silicon nitride precursors are dichlorosilane and ammonia.

Advantageously, the donor substrate is a multilayer substrate constituted by a silicon support substrate, a silicon-germanium (SiGe) layer of increasing composition, a relaxed SiGe layer and a strained silicon layer.

According to an implementation variant, the donor substrate and/or the receiver substrate consist of a substrate made of silicon of (100), (110) or (111) crystal orientation.

According to one essential feature of the invention, the process includes a step of detaching a useful layer from the donor substrate.

This step of detaching the useful layer is obtained by at least the succession of the following steps: implantation of ions or of gaseous species from the upper face of the oxide layer deposited on the donor substrate so as to form a buried zone of weakness in said donor substrate; and then cleavage in the zone of weakness resulting in detachment of said useful layer.

The step of implanting ions or gaseous species is carried out after the first heat treatment, and the cleaving step in the zone of weakness is carried out before the second heat treatment.

The parameters of said species implantation are chosen so as to form a zone of weakness in the relaxed SiGe layer of the multilayer donor substrate.

Moreover, the process includes, prior to the step of bringing the receiver substrate into contact with the oxide layer or the nitride layer deposited on the donor substrate, a step of preparing the surfaces of said substrates.

Another subject of the invention is a substrate obtained by the process according to the invention.

For this purpose, the invention, proposed a substrate comprising at least an oxide or nitride layer deposited on a donor substrate and/or receiver substrate; the oxide or nitride layer being degassed and having a refractive index smaller than the refractive index of an oxide or nitride layer of the same composition formed by thermal growth.

According to an essential feature of the substrate according to the invention, the refractive index of the degassed oxide or nitride layer is between 1.435 and 1.455 for a laser wavelength of 633 nm.

BRIEF DESCRIPTION OF THE DRAWINGS

Other advantages and features will become more clearly apparent from the following description, given by way of non-limiting example, of the process of fabricating a substrate according to the invention, and from the drawings in which:

FIG. 4 is a graph showing the variation in the thickness of the oxide layer as a function of the duration and the temperature of the heat treatment;

FIG. 5 is a graph showing the variation in the refractive index of the oxide layer as a function of the densification temperature; and FIG. 6 is a comparative table of the etching rate on a thermal oxide and the etching rate on a deposited oxide that has undergone a densification in accordance with the invention.

DETAILED DESCRIPTION OF THE INVENTION

The process according to the invention for fabricating a multilayer and monolayer substrate comprising a buried oxide layer, and more particularly SeOI, SOI and sSOI substrates, will be described below. However, it is quite obvious that the process according to the invention may be adapted to cover UTBOX substrates or other substrates without thereby departing from the scope of the invention.

Figure 1:
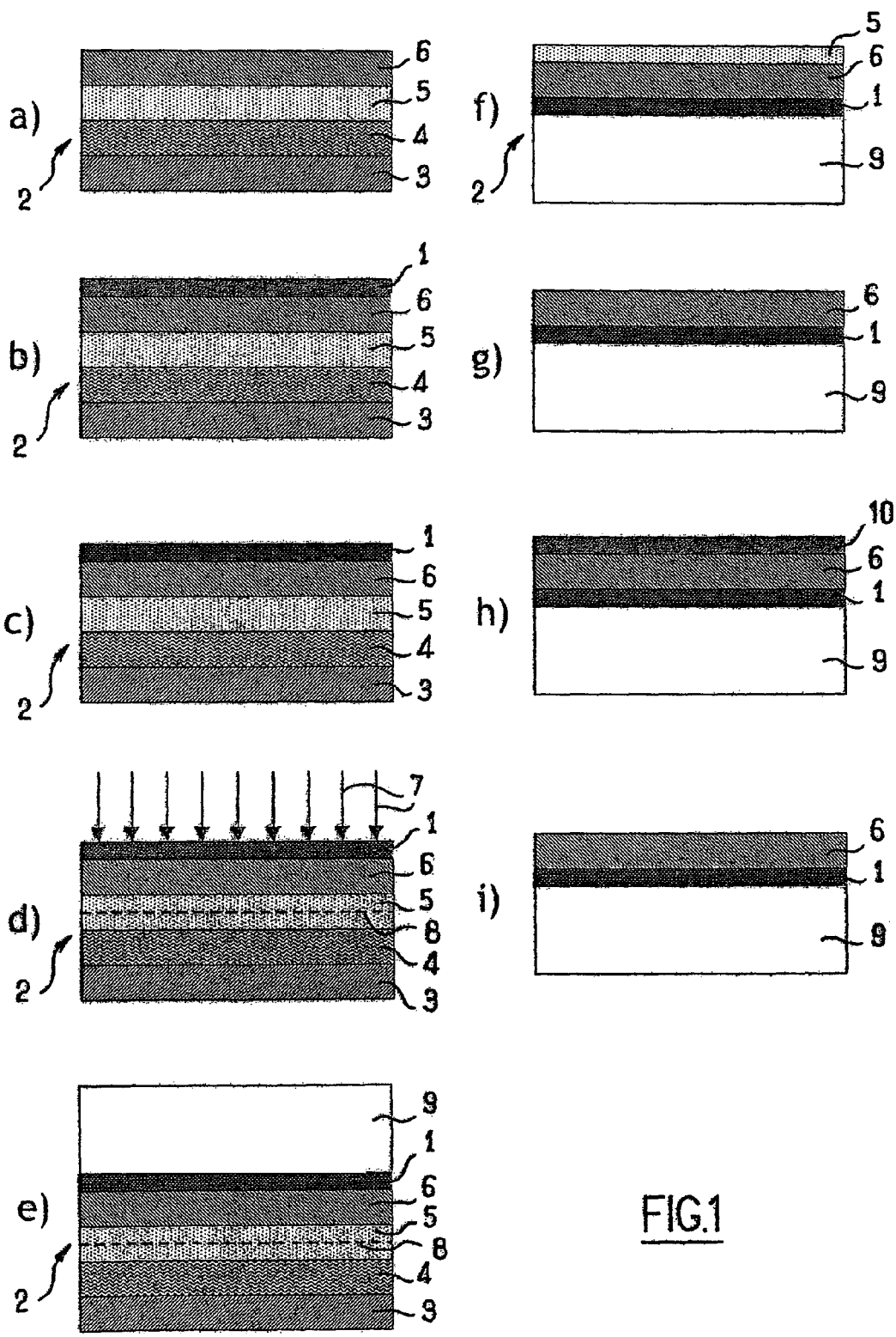
FIG. 1 shows schematically steps of an example of how the process according to the invention is implemented.

Referring to FIG. 1, the process according to the invention comprises a first step of depositing an oxide layer 1 (FIG. 1*b*) on a multilayer substrate 2, called a donor substrate including, in this particular embodiment, a silicon support substrate 3, a silicon-germanium (SiGe) layer 4 of increasing composition, a relaxed SiGe layer 5 and a strained silicon layer 6 (FIG. 1*a*).

It should be noted that the oxide layer 1 may be substituted with a nitride layer without departing from the scope of the invention, said layer being deposited by the reaction of dichlorosilane (DCS, i.e. $SiH_2Cl_2$) with ammonia.

Next, with reference to FIG. 1*c*, a first heat treatment is applied at a temperature of between 600 and 1000° C. for a time of between a few minutes and a few hours and preferably at a temperature of 800° C. for 2 to 4 hours, in a non-oxidizing inert gas or a mixture of inert gases.

The inert atmosphere thus created is for example composed of argon (Ar), nitrogen ($N_2$) or xenon (Xe) or in a mixture of at least two of these inert gases.

This first heat treatment at relatively low temperature induces densification of the oxide layer 1, as well as degassing of certain species while still maintaining a certain degree of porosity of the deposited oxide layer 1.

The porosity of the oxide layer 1 allows good bonding to be achieved when bringing it into contact with a second substrate, as will be explained in detail later.

The degassed oxide or nitride layer 1 has a lower refractive index than the refractive index of an oxide or nitride layer of the same chemical composition formed by thermal growth. Said refractive index of the degassed oxide layer (1) is preferably between 1.435 and 1.455 for a laser wavelength of 633 nm of a device for measuring the refractive index, for example by ellipsometry.

Next, ions and/or gaseous species 7 are implanted through the upper face of the donor substrate 2, that is to say the oxide layer 1, in order to form, in said donor substrate 2, a weakened buried zone 8; shown as the dashed line in FIG. 1*d*, in accordance with the Smart Cut™ method as described in the publication "Silicon-On-Insulator Technology: Materials to VLSI", by Jean-Pierre Colinge, 2nd edition, published by Kluwer Academic Publishers, pages 50 and 51.

The zone 8 consists of microcavities and is formed in the relaxed SiGe layer 5. As will be seen later, this weakened buried zone 8 allows part of the donor substrate 2 to be detached.

This weakening implantation step preferably employs an implantation (of hydrogen alone, of helium alone, etc.) or a co-implantation of at least two different atomic species, for example hydrogen and helium which are implanted sequentially, the helium being preferably implanted before the hydrogen.

In this example, it will be seen that the parameters of said species implantation are chosen so as to constitute a zone of weakness 8 in the relaxed SiGe layer 5 of the substrate 2.

However, the parameters of the implantation may be chosen in such a way that the weakening zone 8 is located in any layer of said donor substrate 2.

Next, with reference to FIG. 1*e*, a receiver substrate 9, for example made of silicon, is bonded to the upper layer of the donor substrate 2. It is therefore understood that the first heat treatment of the oxide layer (1) deposited on the donor substrate (2) is realised before bonding the donor substrate (2) and the receiver substrate (9).

In the rest of the text, the term "bonding" is understood to mean the intimate contact between the receiver substrate 9 and the oxide layer 1 of the donor substrate 2.

It will be noted that since the porosity of the oxide layer 1 has been preserved during the first heat treatment, the quality of the bonding is particularly good.

In addition, prior bonding the donor substrate 2 to the receiver substrate 9, said donor substrate 2 and receiver substrate 9 are cleaned with an ozone mixture and/or a mixture of an RCA (Radio Corporation of America)-type composition composed of SC1 and SC2 [SC standing for Standard Cleaning] well known to those skilled in the art. The surfaces may also be brushed, rinsed and dried, but also may undergo a plasma activation step, for example in oxygen or nitrogen.

Referring to FIG. 1f, part of the donor substrate 2 in the zone of weakness 8 is detached in accordance with the Smart Cut™ method, by heat treatment in an inert atmosphere at a temperature of about 500° C. and/or with the application of stress.

It has to be noticed that the useful layer 1 may be detached by any other means well known to those skilled in the art, such as for example by thinning the donor substrate 2, for example using a BESOI-type method.

Next, the upper surface of the relaxed SiGe layer 5 remaining on the donor substrate 2 is abraded by any suitable method such as a CMP (Chemical Mechanical Planarization) method, until the strained silicon layer 6 constitutes the upper layer of the substrate (FIG. 1g).

It should be noted that the upper surface of the relaxed SiGe layer 5 remaining may in particular be abraded by applying:
 a wet oxidation treatment followed by a selective etching step when the weakened buried zone 8 is formed by co-implantation of species into the substrate;
 a CMP polishing step followed by a selective etching step when the weakened buried zone 8 has been formed by implantation of a single species; and
 a simple selective etching step.

Referring to FIG. 1h, a second oxide or nitride layer 10, called a sacrificial layer, is deposited on the strained silicon layer 6.

Next, a second heat treatment is applied at a temperature between 1000 and 1200° C. for a time between few minutes and few hours, and preferably at a temperature of 1100° C. for 2 hours, in a non-oxidizing inert gas or in a mixture of inert gases. In the same way as previously, the inert atmosphere thus created is for example composed of argon (Ar), nitrogen ($N_2$) or xenon (Xe) or in a mixture of at least two of these inert gases.

During this second heat treatment, the buried oxide layer 1 is densified and any defects initially present in the surface layer of the substrate are removed. Moreover, this second densification heat treatment allows the substrate bonding interfaces to be reinforced.

It is quite obvious that the oxide or nitride layer 1 may be deposited on the receiver substrate 9, the receiver substrate 9/oxide layer 1 assembly being subjected to the first heat treatment prior to the receiver substrate 9 and donor substrate 2 coming into contact with each other without thereby departing from the scope of the invention.

Finally, referring to FIG. 1i, the sacrificial oxide layer 10 that has allowed the strained silicon layer 6 to be protected during the second heat treatment, is removed by a hydrofluoric acid (HF) treatment well known to those skilled in the art.

The substrate thus obtained, shown in FIG. 1i, consists of a lower receiver substrate 9 and a strained silicon (sSi) upper layer 6, the receiver substrate 9 being isolated from the strained silicon layer 6 by a densified oxide layer 1.

Referring to FIG. 4, which is a graph showing the variation in thickness of the oxide layer as a function of the duration and temperature of the heat treatment, it is apparent that the densification of the oxide layer is progressive and not complete at temperatures below 800° C., which corresponds to the first heat treatment of the process according to the invention, and that the densification is complete for temperatures of 1000° and 1100° C., which correspond to the second heat treatment of the process. The invention uses the change of the nature of the insulating layer and its physico-chemical properties for fabricating the substrate. The final substrate has, at the end of the process, an insulating layer of very good quality and with a composition different from the insulating layers present in the substrate during its fabrication before the second heat treatment is applied.

Moreover, referring to FIG. 5, which is a graph showing the variation in the refractive index of the oxide layer as a function of the densification temperature, it may be seen that the optical index decreases between 500 and 800° C.—this corresponds to the degassing mechanism and the densification during the first heat treatment of the process according to the invention—and that the optical index increases for temperatures above 800° C., indicating that the densification mechanism predominates over the degassing during the second heat treatment of the process, the change in the optical index resulting from a reduction in the porosity.

In addition, with reference to FIG. 6, it is apparent that the etching rate of the oxide deposited, having followed the heat treatments in accordance with the invention, is similar to the etching rate of a thermal oxide so that the quality of the densified deposited oxide at the end of the process is consistent with that of a thermal oxide.

One particular but non-limiting exemplary embodiment of a substrate obtained according to the invention will be described below with reference to FIG. 1.

EXAMPLE 1

An oxide layer 1 (FIG. 1b) is deposited on a multilayer substrate 2 called the donor substrate, consisting of a silicon support substrate 3, a silicon-germanium (SiGe) layer 4 of increasing composition, a relaxed SiGe layer 5 and a strained silicon layer 6 (FIG. 1a).

This oxide layer 1 is a silicon oxide formed from TEOS (tetraethyl orthosilicate, i.e. $Si(OC_2H_5)_4$) with a diluent gas such as oxygen or nitrogen, for example according to a process well known to those skilled in the art. The diluent gas is preferably oxygen to limit the amount of hydrocarbons in the deposited oxide layer 1.

The deposition pressure is between 200 and 700 mTorr, preferably 300 mTorr.

Moreover, the flow rate of the TEOS precursor is between 200 and 600 sccm, preferably 300 sccm, and the oxygen flow rate is between 20 and 100 sccm, preferably 40 sccm.

In addition, the oxide deposition temperature is between 500 and 800° C., preferably between 600 and 700° C.

The thickness of the oxide layer thus deposited is generally between 1000 and 2000 Å, preferably about 1500 Å.

Next, with reference to FIG. 1c, a first heat treatment is applied at a temperature of about 800° C. for about 2 hours, in a non-oxidizing inert gas or a mixture of inert gases.

Next, gaseous species 7 are implanted through the upper face of the donor substrate 2, that is to say the oxide layer 1, in order to form in said donor substrate 2 a weakened buried zone 8, shown as the dashed lines in FIG. 1d, in accordance with the Smart Cut™ method as described in the publication "Silicon-On-Insulator Technology: Materials to VLSI", by Jean-Pierre Colinge, 2nd edition, published by Kluwer Academic Publishers, pages 50 and 51.

This weakening implantation step is for example carried out by implanting hydrogen at an energy of around 30 keV and at a dose of about $6 \times 10^{16}$ at/cm$^2$.

According to an alternative implementation, the implantation step could be carried out by co-implanting hydrogen with an energy of around 30 keV and with a dose of about $1.5 \times 10^{16}$ at/cm$^2$ and helium with an energy of around 50 keV and a dose of about $1.5 \times 10^{16}$ at/cm$^2$.

More generally, co-implantation is carried out with a hydrogen energy of around 20 to 40 keV and a helium energy of around 30 to 60 keV, the doses for both species being around 1 to $2 \times 10^{16}$ at/cm$^2$.

In this example, it may be seen that the parameters of said species implantation are chosen to form a weakening zone 8 in the relaxed SiGe layer 5 of the substrate 2.

Next, with reference to FIG. 1e, a receiver substrate 9, obtained for example in silicon, is bonded to the upper surface of the donor substrate 2.

Additionally, prior to the bonding of the receiver substrate 9 with the donor substrate 2, said donor substrate 2 and receiver substrate 9 are cleaned with a mixture of ozone and/or of a composition of the RCA (Radio Corporation of America)-type well known to those skilled in the art and/or of deionized water, by means of brushing, rinsing and drying.

The step of preparing the surfaces of the substrates could also consist of activating said surfaces by a plasma in oxygen or nitrogen.

Next, referring to FIG. 1f, the assembly formed by the receiver substrate 9 and the donor substrate 2 is turned upside down, and then part of the donor substrate 2 is detached from a weakening zone 8 in accordance with the Smart Cut™ method by a heat treatment at a temperature of about 500° C.

Next, the upper surface of the relaxed SiGe layer 5 remaining on the donor substrate 2 is abraded, by any suitable method such as a CMP (Chemical Mechanical Planarization) method until the strained silicon layer 6 constituted the upper layer of the substrate (FIG. 1g).

The upper surface of the relaxed SiGe layer 5 remaining can be abraded in particular by applying:
  a wet oxidation treatment followed by a selective etching step;
  a heat treatment when the weakened buried zone 8 is formed by an implantation or co-implantation of species into the substrate;
  a CMP polishing step followed by a selective etching step when the weakened buried zone 8 was formed by the implantation of a single species; and
  a simple selective etching step.

Referring to FIG. 1h, a second TEOS oxide layer 10, called the sacrificial layer, is deposited on the strained silicon layer 6 with a thickness of about 100 Å.

Next, a second heat treatment, a densification heat treatment, is applied at a temperature of 1100° C. for 2 hours, in a non-oxidizing inert atmosphere or a mixture of inert gases.

Finally, with reference to FIG. 1i, the sacrificial oxide layer 10 is removed by a hydrofluoric acid (HF) treatment.

Figure 2:
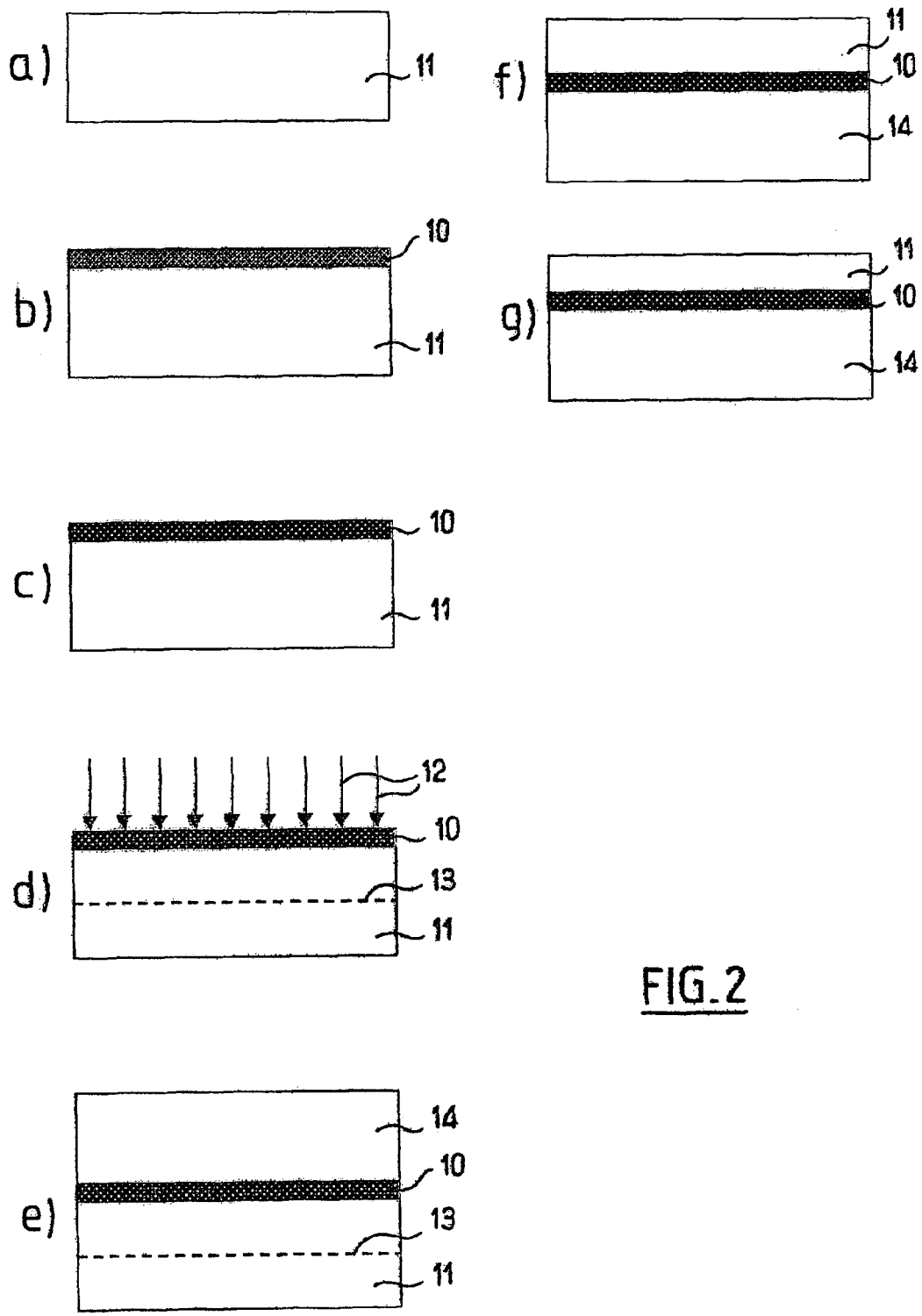
FIG. 2 shows schematically steps of a second example of how the process according to the invention is implemented.

In an alternative way of implementing the process according to the invention, with reference to FIG. 2, said process includes a first step of depositing an oxide layer 10 (FIG. 2b) on a single-layer substrate 11, called the donor substrate, obtained for example from silicon (FIG. 2a), which silicon could be of (100), (110) or (111) crystal orientation.

It should be noted that the oxide layer 1 could be substituted by a nitride layer without departing from the scope of the invention.

Next, with reference to FIG. 2c, a first heat treatment is applied at a temperature of between 600 and 1000° C. during few minutes to few hours, for example 5 minutes to 10 hours, preferably at a temperature of 800° C. for 2 to 4 hours, in a non-oxidizing inert gas or a mixture of inert gases.

The inert atmosphere thus created is for example composed of argon (Ar), nitrogen ($N_2$) or xenon (Xe) or in a mixture of at least two of these inert gases.

This first heat treatment at relatively low temperature leads first of all to the densification of the oxide layer 10, but also to the degassing of certain species, while still retaining a certain degree of porosity of the oxide layer 10 deposited. In addition, the porosity of the oxide layer 10 gives a good bonding when it was brought into contact with a second substrate, as will be explained in detail below.

Next, ions and/or gaseous species 12 are implanted through the upper face of the donor substrate 11, i.e. the oxide layer 10, in order to form in said donor substrate 11 a weakened buried zone 13, shown in FIG. 2d by the dashed line, in accordance with the Smart Cut™ method as described in the publication "Silicon-On-Insulator Technology: Materials to VLSI", by Jean-Pierre Colinge, 2nd edition, published by Kluwer Academic Publishers, pages 50 and 51.

This weakened buried zone 13 allows the detachment of a part of the donor substrate 11.

In the same manner as previously, this weakening implantation step preferably involves implantation (hydrogen alone, helium alone, etc.), or co-implantation of at least two different atomic species, for example hydrogen and helium, implanted sequentially the helium being preferably implanted before the hydrogen.

Next, with reference to FIG. 2e, a receiver substrate 14, for example made of silicon, namely (100), (110) or (111) Si, is bonded to the upper surface of the donor substrate 11, i.e. to the oxide layer 10.

Additionally, before the receiver substrate 14 is bonded to the donor substrate 11, said donor substrate 11 and receiver substrate 14 are cleaned by any appropriate method, as described above.

Referring to FIG. 2f, the assembly formed by the receiver substrate 14 and the donor substrate 11 is detached in the zone of weakness 13 in accordance with the Smart Cut™ method by heat treatment at a temperature of about 500° C. and/or with the application of stress.

Next, with reference to FIG. 2g, a second heat treatment is applied at a temperature between 1000 and 1200° C. for few minutes to few hours, and preferably at a temperature of 1100° C. for 2 hours, in a non-oxidizing inert gas or a mixture of inert gases. In the same way as previously, the inert atmosphere thus created is for example composed of argon (Ar), nitrogen ($N_2$) or xenon (Xe) or in a mixture of at least two of these inert gases.

During this second heat treatment, the buried oxide layer 10 is densified and any defects initially present in the surface layer of the substrate are removed. Moreover, this second heat treatment leads to strengthen the bonding interfaces.

The substrate thus obtained, shown in FIG. 2g, consists in a silicon lower receiver substrate 14 and a silicon upper layer, the receiver substrate 14 being separated from the silicon layer 11 by a densified oxide layer 10.

One particular but non-limiting exemplary embodiment of a substrate obtained according to the invention will be described below with reference to FIG. 2.

EXAMPLE 2

An $SiO_2$ oxide layer 10 (FIG. 2b) obtained from a TEOS precursor is deposited by the LPCVD process on a single-layer substrate 11 called the donor substrate obtained in silicon (FIG. 2a).

The thickness of the oxide layer was between 200 and 500 Å, preferably 300 Å.

Next, with reference to FIG. 2c, a first heat treatment is applied at a temperature of 750° C. for 2 hours, in a non-oxidizing inert gas or a mixture of inert gases.

Next, hydrogen species 12 are implanted through the upper face of the donor substrate 11, that is to say the oxide layer 10, in order to form in said donor substrate 11 a weakened buried zone 13, shown in FIG. 1d by the dashed line, in accordance with the Smart Cut™ method as described in the publication "Silicon-On-Insulator Technology: Materials to VLSI", by Jean-Pierre Colinge, 2nd edition, published by Kluwer Academic Publishers, pages 50 and 51.

This weakening implantation step involves for example, the implantation of hydrogen with an energy of around 25 keV and a dose of about $5 \times 10^{16}$ at/cm$^2$.

Next, with reference to FIG. 2e, a receiver substrate 14, also obtained in silicon, is bonded to the upper layer of the donor substrate 11, i.e. to the oxide layer 10.

Additionally, before the receiver substrate 14 is bonded to the donor substrate 11, said donor substrate 11 and receiver substrate 14 are cleaned by any appropriate method, as described above.

With reference to FIG. 2f, part of the donor substrate 11 is detached in the zone of weakness 13 in accordance with the Smart Cut™ method by heat treatment at a temperature of about 500° C.

Next, with reference to FIG. 2g, a second densification heat treatment is applied at a temperature of 1100° C. for 2 hours, in a non-oxidizing inert gas or a mixture of inert gases.

Figure 3:
FIG. 3 shows schematically steps of a final implementation variant of the process according to the invention.
Figure 3:
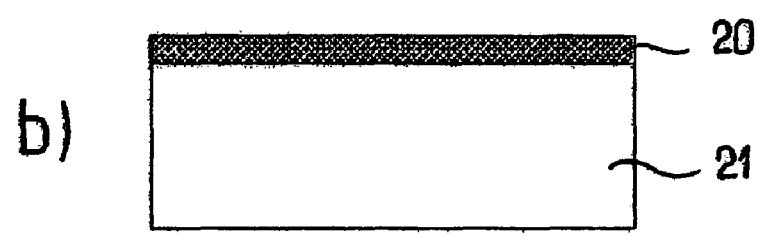
Figure 3:
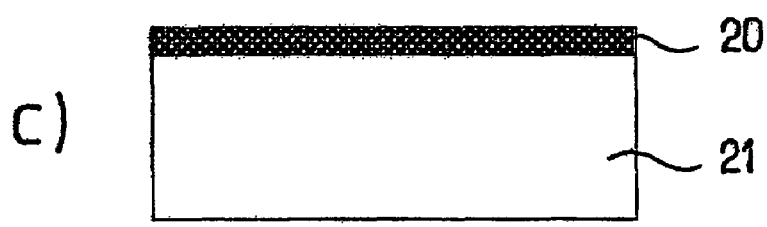
Figure 3:
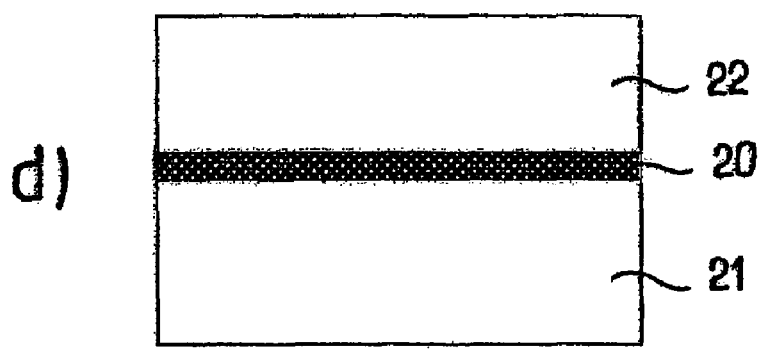

In a final alternative way of implementing the process according to the invention, this consists in a method of bonding a first substrate to a second substrate with reference to FIG. 3.

Said process according to the invention includes a first step of depositing an oxide layer 20 (FIG. 3b) or a nitride layer on a first substrate 21 called the donor substrate (FIG. 3a) obtained in any material, such as silicon, GaN, etc.

Next, with reference to FIG. 3c, a first heat treatment is applied at a temperature between 600 and 1000° C. for a time between few minutes to few hours, preferably at a temperature of 800° C. for 2 to 4 hours, in a non-oxidizing inert gas or a mixture of inert gases.

The inert atmosphere thus created is for example composed of argon (Ar), nitrogen ($N_2$) or xenon (Xe) or in a mixture of at least two of these inert gases.

This first heat treatment at relatively low temperature induces the densification of the oxide layer 20, and the degassing of certain species, while still maintaining a certain degree of porosity of the deposited oxide layer 20.

The porosity of the oxide layer 20 makes possible a good bonding when it is brought into contact with a second substrate.

It is quite obvious that an oxide or nitride layer could be deposited on any substrate without departing from the scope of the invention.

Next, with reference to FIG. 3d, a second substrate 22, called receiver substrate, also obtained in any material, such as silicon and GaN for example, is bonded to the first substrate 21 by bringing the receiver substrate 22 into intimate contact with the oxide layer 20 of the donor substrate 21.

It will be noted that the porosity of the oxide layer 1 is maintained during the first heat treatment, while the quality of the bonding was particularly good.

Additionally, before the substrates 21, 22 are bonded, said substrates 21, 22 are cleaned with a mixture of ozone and of a composition of the RCA (Radio Corporation of America) type, well known to those skilled in the art.

Next, a second heat treatment which is a densification heat treatment is applied at a temperature of between 1000 and 1200° C. for a time of between a few minutes and a few hours, preferably at a temperature of 1100° C. for 2 hours, in a non-oxidizing inert gas or a mixture of inert gases. In the same way as previously, the inert atmosphere thus created is for example composed of argon (Ar), nitrogen ($N_2$) or xenon (Xe) or in a mixture of at least two of these inert gases.

During this second heat treatment, the buried oxide layer 20 is densified and any defects initially present in the surface layer of the substrate were eliminated. Moreover, this second heat treatment leads to strengthen the substrate bonding interfaces.

Finally, it is obvious that the examples that have just been given are merely particular illustrations which are in no case limiting as regards the fields of application of the invention.

The invention claimed is:

1. A process for fabricating a substrate with a buried oxide layer for the production of electronic components, which comprises:
    depositing an oxide or nitride layer on either a donor substrate or a receiver substrate;
    bonding the donor and receiver substrates together with the oxide or nitride layer therebetween at a bonding interface;
    conducting a first heat treatment of the oxide or nitride layer after it is deposited on the donor or receiver substrate and before bonding the substrates together, wherein the first heat treatment includes applying a temperature of 600 to 1000° C. during a few minutes to a few hours in a non-oxidizing inert gas or inert gas mixture; and
    conducting a second heat treatment of a substrate that includes the receiver substrate, the oxide layer and all or part of the donor substrate;
    wherein the second heat treatment is a densification heat treatment that is conducted at a higher temperature than the first heat treatment with the heat treatments providing reinforcing of the bonding interface.

2. The process of claim 1, wherein the first heat treatment includes applying a temperature of 800° C. for 2 to 4 hours.

3. The process of claim 1, wherein the second heat treatment includes applying a temperature of 1000 to 1200° C. during a few minutes to a few hours in a non-oxidizing inert gas or inert gas mixture.

4. The process of claim 2, wherein the inert gas for either the first or second heat treatment is argon (Ar), nitrogen ($N_2$), xenon (Xe) or a mixture thereof.

5. The process of claim 1, wherein the oxide layer is obtained from an oxide precursor of tetraethyl orthosilicate (TEOS).

6. The process of claim 1, wherein the nitride layer is obtained from silicon nitride precursors of dichlorosilane and ammonia.

7. The process of claim 1, wherein the donor substrate is a multilayer substrate.

8. The process of claim 7, wherein the donor substrate is constituted by a silicon support substrate, a silicon-germanium (SiGe) layer of increasing composition, a relaxed SiGe layer and a strained silicon layer.

9. The process of claim 1, wherein the donor or receiver substrate is made of silicon of (100), (110) or (111) crystal orientation.

10. The process of claim 1, which further comprises forming a zone of weakness in the donor substrate and detaching a surface layer from the donor substrate so that the second heat treatment is conducted on a substrate that includes the receiver substrate, the oxide layer and the useful layer that is detached from the donor substrate.

11. The process of claim 10, wherein the zone of weakness is obtained by implantation of ions or gaseous species from the upper face of the oxide (or nitride) layer deposited on the donor substrate, and the surface layer is detached by cleavage in the zone of weakness.

12. The process of claim 1, wherein the implanting of ions or gaseous species is carried out after the first heat treatment, and the cleavage is carried out before the second heat treatment.

13. The process of claim 1, wherein the donor substrate is a multilayer substrate constituted by a silicon support substrate, a silicon-germanium (SiGe) layer of increasing composition, a relaxed SiGe layer and a strained silicon layer and the ions or gaseous species are chosen to have an implantation energy that forms the zone of weakness in the relaxed SiGe layer of the multilayer donor substrate.

14. The process of claim 1, which further comprises preparing the surfaces of the substrates prior to bonding.

15. The process of claim 1 which further comprises providing a substrate that includes at least the oxide or nitride layer deposited thereon, wherein the oxide or nitride layer is degassed and has a refractive index smaller than the refractive index of an oxide or nitride layer of the same composition formed by thermal growth.

16. The process of claim 15, wherein the refractive index of the degassed oxide or nitride layer is between 1.435 and 1.455 for a laser wavelength of 633 nm.

* * * * *